US008659900B2

(12) United States Patent
Takayanagi et al.

(10) Patent No.: US 8,659,900 B2
(45) Date of Patent: Feb. 25, 2014

(54) CIRCUIT BOARD INCLUDING A HEAT RADIATING PLATE

(75) Inventors: Takahito Takayanagi, Tochigi (JP); Masami Ogura, Tochigi (JP); Kosuke Kasagi, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 335 days.

(21) Appl. No.: 13/096,207

(22) Filed: Apr. 28, 2011

(65) Prior Publication Data

US 2011/0267781 A1 Nov. 3, 2011

(30) Foreign Application Priority Data

Apr. 28, 2010 (JP) ................................. 2010-102881

(51) Int. Cl.
*H05K 7/20* (2006.01)
*H01L 23/34* (2006.01)

(52) U.S. Cl.
USPC ........... 361/704; 361/717; 257/706; 257/713; 257/703; 363/141

(58) Field of Classification Search
USPC .................... 361/679.46–679.54, 688–723
See application file for complete search history.

(56) References Cited

U.S. PATENT DOCUMENTS

| 5,646,445 | A | * | 7/1997 | Masumoto et al. | ........... 257/723 |
| 5,767,576 | A | * | 6/1998 | Kobayashi et al. | ........... 257/701 |
| 6,563,211 | B2 | * | 5/2003 | Fukada et al. | ................. 257/706 |
| 6,762,491 | B1 | * | 7/2004 | Hatae et al. | ..................... 257/712 |
| 7,656,672 | B2 | * | 2/2010 | Schilling et al. | .............. 361/736 |
| 7,755,898 | B2 | * | 7/2010 | Aoki et al. | ...................... 361/710 |
| 7,859,103 | B2 | * | 12/2010 | Aoki et al. | ...................... 257/714 |
| 2002/0047132 | A1 | | 4/2002 | Fukada et al. | |
| 2003/0011057 | A1 | | 1/2003 | Nakajima et al. | |
| 2006/0157862 | A1 | | 7/2006 | Nishimura et al. | |

FOREIGN PATENT DOCUMENTS

| JP | 2003-7966 | 1/2003 |
| JP | 2003-142689 | 5/2003 |
| JP | 2005-45238 | 2/2005 |
| JP | 2005-150309 | 6/2005 |
| JP | 2007-234690 | 9/2007 |
| JP | 2008-91959 | 4/2008 |
| WO | 2009/081689 | 7/2009 |
| WO | 2009/101685 | 8/2009 |

* cited by examiner

*Primary Examiner* — Zachary M Pape
(74) *Attorney, Agent, or Firm* — Rankin, Hill & Clark LLP

(57) ABSTRACT

A circuit board is provided with a plurality of arms and a heat radiation plate. The insulating substrate of the each of the arms includes: a passive element region to which a passive element is connected; an active element region to which an active element is connected; and a wiring region on which wiring lines of the element group are laid. In the each of the arms, the passive element region, the active element region and the wiring region align in a lengthwise direction of the insulating substrate, and the passive element region and the wiring region are arranged on both sides of the active element region which is located centrally.

18 Claims, 3 Drawing Sheets

CIRCUIT BOARD INCLUDING A HEAT RADIATING PLATE

BACKGROUND OF THE INVENTION

1. Field of the Invention

The present invention relates to a circuit board which is mounted with groups of elements each including an active element and a passive element. More particularly, it relates to a circuit board which ensures an endurance reliability and a heat radiation performance over fixed levels, and which can be configured to a small size.

2. Related Art

Heretofore, a circuit board for a power source apparatus (hereinbelow, termed the "powermodule" on occasion), for example, the power module of an inverter which is mounted on a system for the drive control of an electric vehicle, or the like, has been often configured as stated below (refer to Patent Documents 1 and 2).

Such a power module is provided with a board (hereinbelow, termed the "arm") which is so configured that one of two conductor layers respectively disposed on the two surfaces of an insulating substrate, and a semiconductor chip including a switching element, etc. are joined by a first solder portion, and a heat radiation plate. The other of the two conductor layers disposed on the insulating substrate of the arm, and the heat radiation plate are joined by a second solder portion.

[Patent Document 1] US 2002/0047132
[Patent Document 2] US 2006/0157862

A power module which ensures an endurance reliability and a neat radiation performance over fixed levels and which is configured to a small size, has been demanded in recent years. However, any power module capable of satisfactorily complying with the demand has not been found among power modules including ones disclosed in Patent Documents 1 and 2.

By way of example, as a test for verifying the endurance reliability of a general power module, there is a temperature cycle test in which the power module is repeatedly exposed under both the environments of a low temperature and a high temperature.

From the result of the temperature cycle test, it has been known that thermal stresses are applied between an insulating substrate and a heat radiation plate, that cracks appear at the fillet parts of a second solder portion around the corners of the insulating substrate, and that the cracks evolve gradually from the corners toward the center of the insulating substrate. It has also been known that, when such cracks evolve to arrive directly under a semiconductor chip, the heat radiation performance for heat generated from the semiconductor chip worsens.

Nevertheless, in the power module disclosed in Patent Document 1, a plurality of semiconductor chips having an identical function are respectively mounted near the corners of a single insulating substrate. Therefore, the power module disclosed in Patent Document 1 undergoes the influence of the cracks on the plurality of semiconductor chips earlier, and ensuring an endurance reliability and a heat radiation it performance degrades correspondingly.

Incidentally, Patent Document 2 discloses a technique in which a single semiconductor chip is mounted on substantially the central part of an insulating substrate. When the power module of Patent Document 2 adopting such a technique is compared with the power module of Patent Document 1, the time at which the semiconductor chip undergoes the influence of cracks seems to delay in correspondence with the existence thereof at the central part.

The "semiconductor chip" termed in Patent Document 2, however, signifies the whole element group which includes an IGBT (Insulated Gate Bipolar Transistor) being an active element that performs an active operation such as a switching operation, and an FWD (Free Wheeling Diode) being a passive element that does not perform such an active operation.

Accordingly, even when the whole element group is merely mounted on the central part, there is a drawback as stated below. If the insulating substrate is small, eventually part of the element group will exist near the corner of the insulating substrate, and the early influence of the cracks will be unavoidable. Herein, in order to avoid the early influence of the cracks (in order to delay the time of the influence), the size (area) must be made much larger than the size of the whole element group being the whole semiconductor chip, and this is contradictory to the requirement of the reduction of the size.

Besides, by way of example, the solder thickness of the second solder portion is not constant over the whole circuit board, and a phenomenon in which the arm inclines, sometimes occurs. In such a case, a solder thickness directly under the semiconductor chip differs every power module, with the result that also a thermal resistance differs. Concretely, in relation to the thermal conductivity of a solder and the solder thickness, the increase of the solder thickness leads to the tendency that the thermal resistance enlarges correspondingly, so a heat radiation property worsens. Accordingly, in the power module in which the solder thickness directly under the semiconductor chip is large, the thermal resistance enlarges correspondingly, and it is apprehended to exert influence on the heat radiation performance.

Besides, the thermal stress which incurs the cracks stated above depends on the solder thickness of the second solder portion, and it becomes larger as the solder thickness becomes smaller. Therefore, in the power module in which the solder thickness directly under the semiconductor chip is small, the possibility of the appearance of the cracks enlarges correspondingly, and the solder thickness of the second solder portion is apprehended to exert influences on the endurance reliability and the heat radiation performance.

Nevertheless, the semiconductor chip is not arranged in consideration of such a solder thickness of the second solder portion, in any of the prior-art power modules including ones disclosed in Patent Documents 1 and 2. The solder thickness of the second solder portion is therefore apprehended to exert influences on the endurance reliability and the heat radiation performance.

Incidentally, the demand of ensuring the endurance reliability and the heat radiation performance over fixed levels and being configured to a small size is required, not only in the power modules, but also generally in a circuit board which is mounted with an element group including an active element and a passive element.

SUMMARY OF THE INVENTION

One or more embodiments of the present invention provide a circuit board which is mounted with an element group including an active element and a passive element, and which ensures an endurance reliability and a heat radiation performance over fixed levels and can be configured to a small size.

The circuit board (for example, a semiconductor device 11 in an exemplary embodiment) may include:

a plurality of arms (for example, an upper arm 21U and a lower arm 21L in the exemplary embodiment) each of which is so configured that one of two conductor layers (for example, metal conductor layers 41F and 41R in the exemplary embodiment) respectively disposed on two surfaces of an insulating substrate (for example, an insulating substrate 41 in the exemplary embodiment), and an element group including a single active element (for example, an IGBT 42 in the exemplary embodiment) and a single passive element (for example, an FWD 43 in the exemplary embodiment) are joined by a first solder portion (for example, a first solder portion 51 in the exemplary embodiment); and a heat radiation plate which is joined by a corresponding second solder portion (for example, a second solder portion 52 in the exemplary embodiment) with the other of the two conductor layers disposed on the insulating substrate of each of the plurality of arms.

Each of the insulating substrates of the plurality of arms may be formed with:

a passive element region (for example, an FWD die bonding region 41P in the exemplary embodiment) to which the single passive element is joined by the first solder portion;

an active element region (for example, an IGBT die bonding region 41I in the exemplary embodiment) to which the single active element is joined by the first solder portion; and a wiring region (for example, a wire bonding region 41W in the exemplary embodiment) on which wiring lines of the element group are laid.

The regions may align in a lengthwise direction of the two surfaces provided with the two conductor layers, and the passive element region and the wiring region may be arranged on both sides of the active element region located centrally.

In accordance with the above structure, the mounting position of the active element becomes substantially the central position (the formation position of the active element region) of the insulating substrate, so that the solder thickness of the second solder portion directly under the active element as contributes to heat radiation can be held substantially constant without regard to the inclining degree and inclining direction of the second solder portion.

Thus, the heat radiation performance can be ensured over a fixed level without preparing an installation jig as suppresses the inclination of the second solder portion. Besides, the appearance of the above cracks is suppressed, and even in a case where the cracks have appeared, the time of the influence thereof can be delayed, so that the endurance reliability can also be ensured over a fixed level.

Further, the plurality of arms have the respective insulating substrates which are physically isolated. In other words, the insulating substrates are isolated for the respective arms. In addition, one insulating substrate after the isolation is mounted with only one element having an identical function (the active element or the passive element). Thus, it is easily permitted to make the size of the insulating substrate smaller, and in turn, to reduce the size of the whole circuit board.

Still further, the insulating substrate is provided with a wiring region, an active element region and a passive element region so as to align in the lengthwise direction thereof in the order mentioned. Thus, the length of the insulating substrate in a direction (for example, the lateral direction thereof) orthogonal to the lengthwise direction (for example, the longitudinal direction thereof) can be shortened to the degree that a shifting component in a mounting operation is added to the length of the element of the maximum size (for example, the active element) in the same direction. That is, it is easily permitted to make the size of the insulating substrate smaller, and in turn, to make the size of the whole circuit board smaller.

In this manner, the endurance reliability and the heat radiation performance are ensured over fixed levels, and the circuit board can be configured to a small size.

The first solder portion and the second solder portion may be made of a lead-free solder. The reason therefor is that the lead-free solder can contribute to environmental protection.

The circuit board may be a circuit board for a power source apparatus, the active element may be a semiconductor element which has a switching function, and the passive element may be a semiconductor element which is used in a pair with the active element.

The active element may be an IGBT, and the passive element may be an FWD.

In accordance with the above structure, the mounting position of an active element becomes substantially the central position (the formation position of the active element region) of an insulating substrate, so that the solder thickness of a second solder portion directly under the active element as contributes to heat radiation can be held substantially constant without regard to the inclining degree and inclining direction of the second solder portion.

Thus, a heat radiation performance can be ensured over a fixed level without preparing an installation jig as suppresses the inclination of the second solder portion. Besides, the appearance of the cracks stated above is suppressed, and even in a case where the cracks have appeared, the time of the influence thereof can be delayed, so that an endurance reliability can also be ensured over a fixed level.

Further, a plurality of arms have the respective insulating substrates which are physically isolated. In other words, the insulating substrates are isolated for the respective arms.

In addition, one insulating substrate after the isolation is mounted with only one element having an identical function (an active element or a passive element). Thus, it is easily permitted to make the size of the insulating substrate smaller, and in turn, to reduce the size of the whole circuit board.

Still further, the insulating substrate is provided with a wiring region, an active element region and a passive element region so as to align in the lengthwise direction thereof in the order mentioned. Thus, the length of the insulating substrate in a direction (for example, the lateral direction thereof) orthogonal to the lengthwise direction (for example, the longitudinal direction thereof) can be shortened to the degree that a shifting component in a mounting operation is added to the length of the element of the maximum size (for example, the active element) in the same direction. That is, it is easily permitted to make the size of the insulating substrate smaller, and in turn, to make the size of the whole circuit board smaller.

In this manner, an endurance reliability and a heat radiation performance are ensured over fixed levels, and the circuit board can be configured to a small size.

Other aspects and advantages of the invention will be apparent from the following description and the appended claims.

DETAILED DESCRIPTION OF EXEMPLARY EMBODIMENT

An exemplary embodiment of the present invention will be described with reference to the drawings.

Figure 1A:
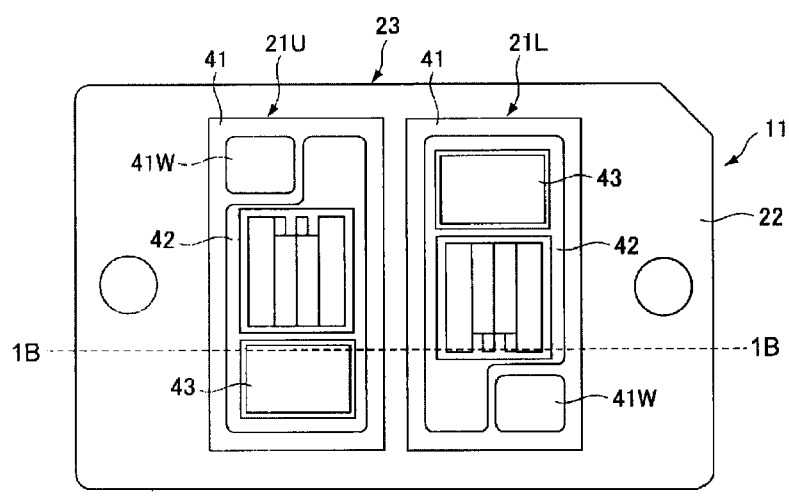
FIG. 1A is a top view of a semiconductor device which is an exemplary embodiment of a circuit board according to the present invention.
Figure 1B:
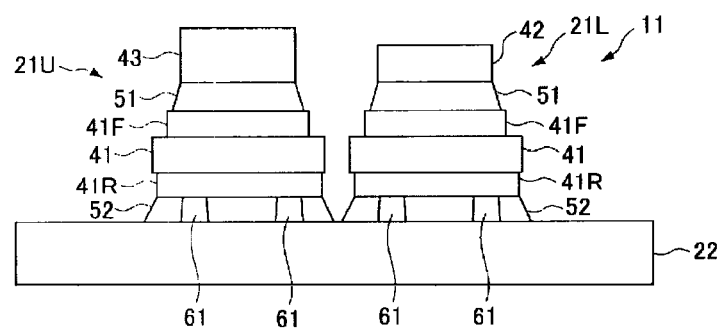
FIG. 1B is a sectional view taken along line 1B-1B in FIG. 1A.

FIGS. 1A and 1B are views showing a schematic configuration of a semiconductor device 11 which is an exemplary embodiment of a circuit board of the present invention. More specifically, FIG. 1A is a top view of the semiconductor device 11, and FIG. 1B is a sectional view of the semiconductor device 11 taken along line 1B-1B in FIG. 1A.

Figure 2:
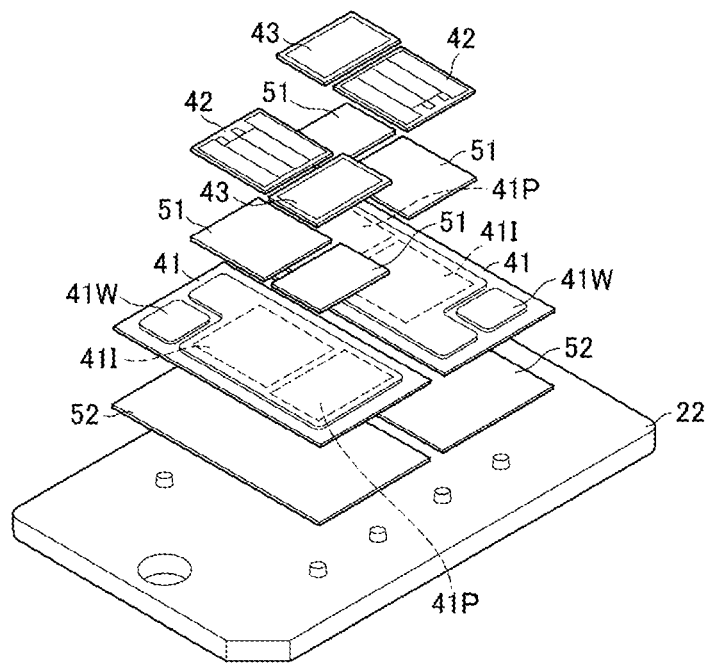
FIG. 2 is a perspective view showing individual constituents of the semiconductor device as are arranged in a stacking order.

FIG. 2 is a perspective view showing the individual constituents of the semiconductor device 11 as are arranged in a stacking order.

The semiconductor device 11 can be adopted as, for example, the power module (circuit board) of an inverter which is mounted on the drive controlling system of an electric vehicle, or the like.

The semiconductor device 11 includes an upper arm 21U being a switching circuit whose input end is connected to the plus side of a DC, a lower arm 21L being a switching circuit whose input end is connected to the minus side of the DC, and a heat radiating base plate 22.

More specifically, one semiconductor device 11 is employed in case of an inverter which outputs a single-phase AC, and two semiconductor devices 11 are employed in case of a 3-level inverter which outputs a single-phase AC. Besides, three semiconductor devices 11 are employed in case of an inverter which outputs a three-phase AC, and six semiconductor devices 11 are employed in case of a 3-level inverter which outputs a three-phase AC.

The upper arm 21U and the lower arm 21L have basically the same functions and configurations, and they are joined to the identical heat-radiating base plate 22 by a solder (second solder portions 52 to be stated later).

The upper arm 210 and the lower arm 21L include insulating substrates 41, IGBTs 42 and FWDs 43, respectively.

Each of the insulating substrates 41 has metal conductor layers (first conductor layers and second conductor layer) 41F and 41R on both the surfaces of a ceramic portion forming an insulating layer.

A group of elements consisting of the IGBT 42 and the FWD 43 is joined to the metal conductor layer 41F by a first solder layer 51. The heat radiating base plate 22 is joined to the metal conductor layer 41R by the second solder layer 52.

By the way, in the exemplary embodiment, both the first solder portion 51 and the second solder portion 52 are made of a general tin-based lead-free solder, for example, SnAgCu.

Besides, regulation members 61 which regulate the spacing between the metal conductor layer 41R of the insulating substrate 41 and the heat radiating base plate 22 are disposed within the second solder portion 52. The solder thickness of the second solder portion 52 can be adjusted by adjusting the thickness of each regulation member 61 (the vertical length thereof in FIG. 1B).

As shown in FIG. 2, on each insulating substrate 41 (in more detail, on each metal conductor layer 41F in FIG. 1A), a wire bonding region 41W, an IGBT die bonding region 41I and an FWD die bonding region 41P are provided so as to align in the lengthwise direction thereof in the order mentioned.

The wire bonding region 41W is a region where the wiring lines of the IGBT 42 and the FWD 43 are disposed, for example, a region where aluminum wires, not shown, are bonded.

The IGBT die bonding region 41I is a region for joining the IGBT 42 by the first solder portion 51.

The IGBT 42 is a semiconductor element which has the function (hereinbelow, termed the "switching function") of performing the operation of changing-over (switching) the input state or a DC into an "ON" state or "OFF" state, thereby to output an AC, in other words, performing a switching operation.

The FWD die bonding region 41P is a region for joining the FWD 43 by the first solder portion 51.

The FWD 43 is a semiconductor element which is electrically connected with the IGBT 42, and which has the function of commutating the AC output current (hereinbelow, termed the "commutation function"). That is, one FWD 43 is employed in a pair with one IGBT 42.

In this manner, each of the upper arm 21U and the lower arm 21L is mounted with semiconductor elements having different functions and different sizes, such as one IGBT 42 and one FWD 43, under the design idea that it is not mounted with two or more semiconductor elements having an identical function.

Here, the IGBT 42 is a so-called "active element" for the reason that it is caused to demonstrate a switching function, thereby to perform the active operation (switching operation) of changing a DC into an AC. In contrast, the FWD 43 is a so-called "passive element" for the reason that, even when it is caused to demonstrate a commutating function, it does not perform any active operation. Therefore, the IGBT 42 being the active element becomes larger than the FWD 43 being the passive element, in the quantity of heat generation and also in size.

Besides, the aluminum wires (not shown) which are bonded to the wire bonding region 41W, merely undergo the flows of currents and do not perform any active operation, so that they are smaller than the IGBT 42 in the quantity of heat generation.

For this reason, the heat radiation performance of the whole semiconductor device 11 depends upon the capability of radiating the heat generation from the IGBT 42. In the exemplary embodiment, therefore, the IGBT die bonding region 41I where the IGBT 42 is disposed is centrally located in the insulating substrate 41, and the wire bonding 41W and the FWD die bonding region 41P are located on both the sides of the region 41I so as to enhance the capability of radiating the heat generation from the IGBT 42 (the details will be stated later in the description of advantages).

Next, the following items (1) through (9) will be individually described as the operations and advantages of the semiconductor device 11:

(1) In the exemplary embodiment, the upper arm 21U and the lower arm 21L have the respective insulating substrates 41 which are physically isolated. In other words, the insulating substrates 41 are isolated for the side of the upper arm 21U and the side of the lower arm 21L. In addition, one insulating substrate 41 after the isolation is mounted with only one semiconductor element having the identical function. More specifically, in each of both the insulating substrate 41 for the upper arm 21U and the insulating substrate 41 for the lower arm 21L, only one IGBT 42 having the switching function is mounted, and only one FWD 43 having the commutation function is mounted.

Thus, it is easily permitted to reduce the size of the insulating substrate 41.

(2) Owing to the reduction of the size of the insulating substrate 41, also the joining region of the second solder portion 52 can be reduced.

Thus, it is permitted to adopt a lead-free solder which can contribute to environmental protection required in recent years, for the second solder portion 52.

More specifically, as compared with a lead solder, the lead-free solder has the merit that it can contribute to the environmental protection in correspondence with being free from lead, whereas it has the demerit that it is inferior in wettability. On account of such a demerit, it is apprehended that a large number of voids will appear during the fusion of the lead-free solder. As a technique for eliminating such voids, there has hitherto been a technique wherein the lead-free solder is exposed to a vacuum state (hereinbelow, termed the "vacuum void elimination technique").

However, in a case where the joining region of the lead-free solder is large, the elimination of the voids becomes difficult, and the available percentage of manufacture worsens, in spite of the application of the vacuum void elimination technique.

Accordingly, a second solder portion which joins an insulating substrate and semiconductor elements in a prior-art semiconductor device has a large joining area, and it has been difficult of adopting the lead-free solder.

In contrast, in the exemplary embodiment, the joining region of the second solder portion 52 is small, so that even when the lead-free solder is adopted, the voids can be eliminated more efficiently than in the prior art by applying the vacuum void elimination technique.

(3) As a manufacturing technique for the semiconductor device 11, the exemplary embodiment adopts a technique wherein a poise is placed on the element group consisting of the IGBT 42 and the FWD 43 during reflow, thereby to apply a fixed surface pressure downward from the element group (a direction toward the insulating substrate 41 in FIG. 1B). In the technique, when the area of the element group is large, the weight of the poise is enlarged so as to apply a required surface pressure.

Owing to the adoption of the technique, favorable joining and fillet formation are ensured as to the first solder portion 51 which joins the element group consisting of the IGBT 42 and the FWD 43, and the metal conductor layer 41F of the insulating substrate 41.

(4) As stated above, the semiconductor element which has the maximum size (maximum area) and which generates heat most, in the semiconductor device 11 is the IGBT 42 being the active element.

Figure 3:
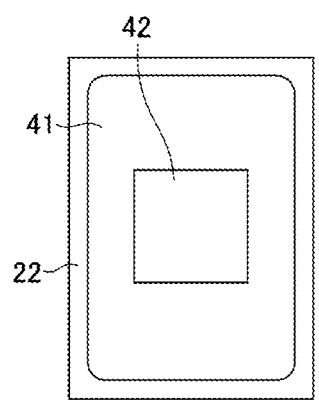
FIG. 3 is a top view schematically showing an arrangement position of an IGBT which is an active element, in the semiconductor device.

FIG. 3 is a top view schematically showing the arrangement position of the IGBT 42.

That is, in FIG. 3, note is taken of the IGBT 42, and hence, the FWD 43 and the wire bonding region 41W are omitted from illustration.

As shown in FIG. 3, the IGBT 42 is mounted on substantially the central part of the insulating substrate 41 (the IGBT die bonding region 41I in FIG. 2).

Thus, the weight of the poise for pressing the IGBT 42 of the maximum size becomes the maximum among the poises used in the technique stated above in Item (3), so that the position of the center of gravity becomes substantially the center of the insulating substrate 41. As a result, even when the first solder portion 51 or the second solder portion 52 has melted during the reflow, the occurrence of a phenomenon in which the arm such as the upper arm 21U or the lower arm 21L inclines can be suppressed.

(5) It is assumed that, in spite of the measure of Item (4), the upper arm 21U or the lower arm 21L and the heat radiating base plate 22 have been joined in a state where the second solder portion 52 inclines.

Figure 4A:
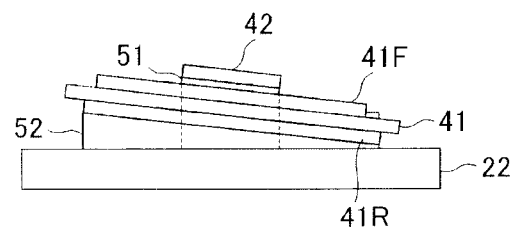
FIGS. 4A and 4B are sectional views for schematically showing a situation where an upper arm or a lower arm and a heat radiating base plate are joined in a slant state of a second solder portion.
Figure 4B:
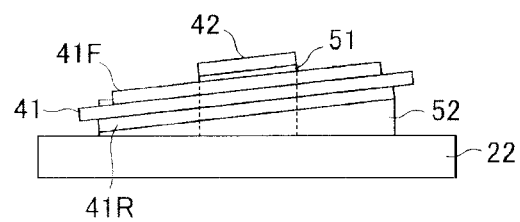

FIGS. 4A and 4B are sectional views schematically showing situations in each of which the upper arm 21U or the lower arm 21L and the heat radiating base plate 22 have been joined in the state where the second solder portion 52 inclines in such a manner.

FIG. 4A shows the state where the second solder portion 52 inclines from a left end side toward a right end side in the figure, whereas FIG. 4B shows the state where the second solder portion 52 inclines from the right end side toward the left end side in the figure.

As seen from FIGS. 4A and 4B, the thickness of the upper arm 21U or the lower arm 21L (the length thereof in a vertical direction in the figure) tends to become large at one end of right and left ends in the figure and to become small at the other end, with respect to substantially the central part of the insulating substrate 41, irrespective of whether the second solder portion 52 inclines in a rightward direction or a leftward direction in the figure.

Even in such a case, if the quantity of the used solder of the second solder portion 52 is constant, the mean solder thickness (vertical length in the figure) of the second solder portion 52 at substantially the central part of the insulating substrate 41 becomes substantially constant at all times without regard to the degree and direction of the inclination, as seen from FIGS. 4A and 4B.

Further noteworthy is that any installation jig as suppresses the inclination of the second solder portion need not be prepared for making the mean solder thickness of the second solder portion 52 substantially constant at all times in this manner.

(6) Here, as stated above, the semiconductor element which generates heat most in the semiconductor device 11 is the IGBT 42 being the active element. The heat generated from the IGBT 42 is radiated from the heat radiating base plate 22 through the first solder portion 51, the insulating substrate 41 and the second solder portion 52 which are stacked just under the IGBT 42.

Here, as stated above, in relation to the thermal conductivity of the solder and the thickness thereof, the increase of the solder thickness brings forth the tendency that a thermal resistance enlarges correspondingly, so a heat radiation property worsens.

Therefore, the heat radiation performance of the whole semiconductor device 11 depends substantially on the solder thickness directly under the IGBT 42 generating the heat most, that is, the solder thickness of the second solder portion 52 as the first solder portion 51 is thin.

In other words, when the solder thickness of the second solder portion 52 directly under the IGBT 42 disperses, also the heat radiation performance of the semiconductor device 11 disperses, and it is apprehended that a desired heat radiation performance will not be attained.

In order to eliminate such an apprehension, in the exemplary embodiment, the center of gravity of the IGBT 42 is located substantially at the central part of the insulating substrate 41 (refer to FIG. 3) as stated above in Item (4). More specifically, the mean solder thickness of the second solder portion 42 directly under the IGBT 42 becomes substantially constant at all times as stated above in Item (5), so that the desired performance can be ensured in substantially constant fashion as the heat radiation performance of the semiconductor device 11.

(7) As stated above, from the result of the temperature cycle test for verifying the endurance reliability of the general power module, it is known that the thermal stress is applied between the insulating substrate 41 and the heat radiating base plate 22, that cracks appear at the fillet parts of the second solder portion 52 around the corners of the insulating substrate 41, and that the cracks gradually evolve from the corners toward the center of the insulating substrate 41.

Figure 5:
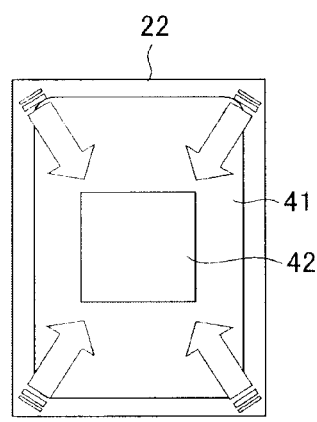
FIG. 5 is a view for schematically showing an evolution of cracks.

FIG. 5 is a view schematically showing the evolution of the cracks.

In FIG. 5, the bases of whitewashed arrows indicate places where the cracks have appeared, and the directions of the whitewashed arrows indicate the evolution directions of the cracks.

It is also known that, when such cracks have evolved to arrive directly under the IGBT 42, a heat radiation performance for heat generation from the IGBT 42 worsens.

In addition, it is also known that the thermal stress which gives rise to the cracks depends on the solder thickness of the second solder portion 52, and that it becomes larger as the solder thickness becomes smaller.

In the exemplary embodiment, therefore, the IGBT 42 is mounted on substantially the central part of the insulating substrate 41 as stated above in Item (4), in order to suppress the enlargement of such a thermal stress (refer to FIG. 3 and FIG. 5). That is, as stated above in Item (5), also the mean solder thickness of the second solder portion 52 directly under the IGBT 42 becomes substantially constant at all times, at such a degree of thickness that the thermal stress is not enlarged.

It is therefore permitted to suppress the enlargement of the thermal stress.

Thus, the evolution of the cracks can be delayed, and the endurance reliability and heat radiation performance of the semiconductor device 11 can be ensured correspondingly.

(8) Assuming that the IGBT 42 is mounted near any of the places of the appearances of the cracks stated above in Item (7), namely, the corners of the insulating substrate 41, it undergoes the influence of the cracks earlier, and ensuring the endurance reliability and heat radiation performance of the semiconductor device 11 degrades correspondingly.

In contrast, in the exemplary embodiment, as shown in FIG. 5, the IGBT 42 is mounted on substantially the central part of the insulating substrate 41. In this manner, the IGBT 42 is mounted on the farthest position from any of the places where the cracks appear. Therefore, the time at which the IGBT 42 undergoes the influence of the cracks can be delayed, and the endurance reliability and heat radiation performance of the semiconductor device 11 can be ensured correspondingly.

(9) On the insulating substrate 41, the wire bonding region 41W, the IGBT die bonding region 41I and the FWD die bonding region 41P are provided so as to align in the lengthwise direction thereof in the order mentioned (refer to FIG. 2).

Thus, the length of the insulating substrate 41 in a direction (for example, the lateral direction thereof) orthogonal to the lengthwise direction (for example, the longitudinal direction thereof) can be shortened to the degree that a shifting component in a mounting operation is added to the length of the IGBT 42 in the same direction. That is, it is permitted to make the size of the insulating substrate 41 smaller than in the prior art, and in turn, to make the size of the whole semiconductor device 11 smaller.

When the above items (1) through (9) are arranged, the principal ones of advantages which can be achieved by the semiconductor device 11 of the exemplary embodiment become as follows: The principal advantages are that the endurance reliability and the heat radiation performance are ensured over the fixed levels, as to the semiconductor device 11 including the upper arm 21U and the lower arm 21L each of which is mounted with one element group that consists of the IGBT 42 being the active element and the FWD 43 being the passive element, and that the semiconductor device 11 can be configured to the small size.

Incidentally, the present invention is not restricted to the foregoing embodiment, but modifications, improvements etc. within a scope capable of accomplishing the object of the present invention shall be covered within the present invention.

By way of example, the present invention can be applied, not only to the power module employing the IGBT, but also to multifarious power modules.

By way of example, the active element need not especially be the IGBT, but any of multifarious switching elements, for example, a GTO (Gate Turn-Off thruster) can be adopted. In this case, a semiconductor element which is used in a pair with the active element can be adopted as the passive element.

Further, the present invention is not especially restricted to the power module, but it can be extensively applied to a circuit board which is provided with:

a plurality of arms; and a heat radiation plate, wherein each of the arms includes an insulating substrate, wherein, in the each of the arms, a first conductor layer is provided on one of two surfaces of the insulating substrate, and a second conductor layer is provided on the other of the two surfaces of the insulating substrate, wherein, in the each of the arms, an element group including an active element and a passive element are connected to the first conductor layer by a first solder portion, wherein, in the each of the arms, the second conductor layer is connected to the heat radiation plate by a second solder portion, wherein the insulating substrate of the each of the arms includes:

a passive element region to which the passive element is connected by the first solder portion;

an active element region to which the active element is connected by the first solder portion; and a wiring region on which wiring lines of the element group are laid, and wherein, in the each of the arms, the passive element region, the active element region and the wiring region align in a lengthwise direction of said two surfaces of the insulating substrate, and the passive element region and the wiring region are arranged on both sides of the active element region located centrally.

Also in this case, the operations and advantages of Items (1) through (9) stated above can be similarly achieved. Therefore, an endurance reliability and a heat radiation performance are ensured over fixed levels, and the circuit board can be configured to a small size.

[Description of Reference Numerals and Signs]

11 semiconductor device,
21U upper arm,
21L lower arm,
22 heat radiating base plate,
41 insulating substrate,
41F, 41R metal conductor layers,
41W wire bonding region, 41I IGBT die bonding region,
41P FWD die bonding region,
42 IGBT,
43 FWD,
51 first solder portion,
52 second solder portion.

What is claimed is:

1. A circuit board comprising:
a plurality of arms; and
a heat radiation plate,
wherein each of the arms includes an insulating substrate,
wherein, in the each of the arms, a first conductor layer is provided on one of two surfaces of the insulating substrate, and a second conductor layer is provided on the other of the two surfaces of the insulating substrate,
wherein, in the each of the arms, an element group including an active element and a passive element are connected to the first conductor layer by a first solder portion,
wherein, in the each of the arms, the second conductor layer is connected to the heat radiation plate by a second solder portion,
wherein the insulating substrate of the each of the arms includes:
a passive element region to which the passive element is connected by the first solder portion;
an active element region to which the active element is connected by the first solder portion; and
a wiring region on which wiring lines of the element group are laid, and
wherein, in the each of the arms, the passive element region, the active element region and the wiring region align in a lengthwise direction of said two surfaces of the insulating substrate, and the passive element region and the wiring region are arranged on both sides of the active element region which is located centrally, and
wherein the active element is positioned on the insulating substrate such that a center of gravity of the active element is located at a center of said two surfaces of the insulating substrate.

2. The circuit board according to claim 1, wherein the first solder portion and the second solder portion are made of a lead-free solder.

3. The circuit board according to claim 1, wherein the circuit board is a circuit board for a power source apparatus,
wherein the active element is a semiconductor element which has a switching function, and
the passive element is a semiconductor element which is used in a pair with the active element.

4. The circuit board according to claim 3, wherein the active element is an IGBT, and
wherein the passive element is an FWD.

5. The circuit board according to 2, wherein the circuit board is a circuit board for a power source apparatus,
wherein the active element is a semiconductor element which has a switching function, and
the passive element is a semiconductor element which is used in a pair with the active element.

6. The circuit board according to claim 5, wherein the active element is an IGBT, and
wherein the passive element is an FWD.

7. The circuit board according to claim 1, wherein, in the each of the arms, a single active element and a single passive element are connected to the insulating substrate.

8. The circuit board according to claim 1, wherein, in the each of the arms, the insulating substrate has a rectangular shape such that a dimension in a lateral direction of said two surfaces of the insulating substrate is less than a dimension in the lengthwise direction of said two surfaces of the insulating substrate, the lateral direction being orthogonal to the lengthwise direction,
the insulating substrate includes a first end portion at a first end thereof in the lengthwise direction, a second end portion at a second end thereof in the lengthwise direction, and a central portion disposed between the first end portion and second end portion in the lengthwise direction, and
the passive element region is disposed in the first end portion, the wiring region is disposed in the second end portion, and the active element region is disposed in the central portion.

9. The circuit board according to claim 8, wherein, in the each of the arms, a single active element and a single passive element are connected to the insulating substrate.

10. The circuit board according to claim 9, wherein the first solder portion and the second solder portion are made of a lead-free solder.

11. The circuit board according to claim 8, wherein the circuit board is a circuit board for a power source apparatus,
wherein the active element is a semiconductor element which has a switching function, and
the passive element is a semiconductor element which is used in a pair with the active element.

12. The circuit board according to claim 11, wherein the active element is an IGBT, and
wherein the passive element is an FWD.

13. A circuit board comprising: a plurality of arms; and a heat radiation plate, wherein each of the arms includes an insulating substrate having a rectangular shape with a dimension in a lengthwise direction being greater than a dimension in a lateral direction which is orthogonal to the lengthwise direction, wherein, in the each of the arms, a first conductor layer is provided on one of two surfaces of the insulating substrate, and a second conductor layer is provided on the other of the two surfaces of the insulating substrate, wherein, in the each of the arms, an element group including an active element and a passive element are connected to the first conductor layer by a first solder portion, wherein, in the each of the arms, the second conductor layer is connected to the heat radiation plate by a second solder portion, wherein the insulating substrate of the each of the arms includes: a first end portion at a first end thereof in the lengthwise direction, a second end portion at a second end thereof in the lengthwise direction, and a central portion disposed between the first end portion and second end portion in the lengthwise direction, the first end portion, central portion, and second end portion being aligned in the lengthwise direction of said two surfaces of the insulating substrate; a passive element region to which the passive element is connected by the first solder portion, the passive element region disposed in the first end portion of the insulating substrate; an active element region to which the active element is connected by the first solder portion, the active element region disposed in the central portion of the insulating substrate; and a wiring region on which wiring lines of the element group are laid, the wiring region disposed in the second end portion of the insulating substrate, and wherein, in the each of the arms, the passive element region, the active element region and the wiring region align in the lengthwise direction of said two surfaces of the insulating substrate, and the passive element region and the wiring region are arranged on both sides of the active element region which is located centrally, wherein the active element is positioned on the insulating substrate such that a center of gravity of the active element is located at a center of said two surfaces of the insulating substrate.

14. The circuit board according to claim 13, wherein, in the each of the arms, a single active element and a single passive element are connected to the insulating substrate.

15. The circuit board according to claim 14, wherein the first solder portion and the second solder portion are made of a lead-free solder.

16. The circuit board according to claim 13, wherein the circuit board is a circuit board for a power source apparatus, wherein the active element is a semiconductor element which has a switching function, and
the passive element is a semiconductor element which is used in a pair with the active element.

17. The circuit board according to claim 16, wherein the active element is an IGBT, and
wherein the passive element is an FWD.

18. A circuit board comprising: a plurality of arms; and a heat radiation plate, wherein each of the arms includes an insulating substrate, wherein, in the each of the arms, a first conductor layer is provided on one of two surfaces of the insulating substrate, and a second conductor layer is provided on the other of the two surfaces of the insulating substrate, wherein, in the each of the arms, a single element group including a single active element and a single passive element are connected to the first conductor layer by a first solder portion, wherein, in the each of the arms, the second conductor layer is connected to the heat radiation plate by a second solder portion, wherein the insulating substrate of the each of the arms includes: a single passive element region to which the single passive element is connected by the first solder portion; a single active element region to which the single active element is connected by the first solder portion; and a wiring region on which wiring lines of the element group are laid, and wherein, in the each of the arms, the passive element region, the active element region and the wiring region align in a lengthwise direction of said two surfaces of the insulating substrate, and the passive element region and the wiring region are arranged on both sides of the active element region which is located centrally, wherein the single active element is positioned on the insulating substrate such that a center of gravity of the single active element is located at a center of said two surfaces of the insulating substrate.

* * * * *